United States Patent
Degen et al.

(10) Patent No.: US 9,936,617 B2
(45) Date of Patent: Apr. 3, 2018

(54) ELECTROMAGNETIC INTERFERENCE SPLICE SHIELD

(71) Applicant: Yazaki North America, Inc., Canton, MI (US)

(72) Inventors: Jason Robert Degen, Plymouth, MI (US); Jesus Joel Pantino, Belleville, MI (US); Matthew James Baker, Flatrock, MI (US)

(73) Assignee: Yazaki North America, Inc., Canton, MI (US)

( * ) Notice: Subject to any disclaimer, the term of this patent is extended or adjusted under 35 U.S.C. 154(b) by 0 days.

(21) Appl. No.: 14/667,116

(22) Filed: Mar. 24, 2015

(65) Prior Publication Data

US 2016/0286697 A1    Sep. 29, 2016

(51) Int. Cl.
*H05K 9/00* (2006.01)
*H01R 13/53* (2006.01)
(Continued)

(52) U.S. Cl.
CPC ............ *H05K 9/0009* (2013.01); *H01R 4/10* (2013.01); *H01R 13/53* (2013.01); *H01R 31/02* (2013.01);
(Continued)

(58) Field of Classification Search
CPC .............................. H05K 9/0098; H01R 31/02
(Continued)

(56) References Cited

U.S. PATENT DOCUMENTS 3,984,622 A * 10/1976 Ross .................. H02G 3/00
                                              156/51
4,769,513 A *  9/1988 Ragland ............. G02B 6/4476
                                              174/11 R
(Continued)

FOREIGN PATENT DOCUMENTS

DE   102013011874 A1   1/2015
JP   H0773931 A        3/1995
(Continued)

OTHER PUBLICATIONS

European Search Report issued in European Patent Application No. EP 16 16 1779 dated Jun. 29, 2016.
(Continued)

*Primary Examiner* — Hung V Ngo
(74) *Attorney, Agent, or Firm* — Foley & Lardner LLP

(57) ABSTRACT

A splice device for electromagnetically sealing a junction or bond between a plurality of cables is provided. A first and second cable each has a conductive core wire, an inner insulation, a braided sleeve, and an insulating cover. The junction or bond fixes and electrically connects the core wire of the second cable to the core wire of the first cable. A plurality of ferrules overlays the braided sleeve and the insulating cover of the first cable and the braided sleeve and the insulating cover of the second cable. A plurality of ring collars overlays the plurality of ferrules and is fixed to the plurality of ferrules. A splice cover or shield overlays the first cable, second cable, plurality of ferrules, and plurality of ring collars and electromagnetically seals the junction/bond between the core wires of the first cable and the second cable.

18 Claims, 5 Drawing Sheets

(51) Int. Cl.
*H01R 31/02* (2006.01)
*H01R 4/10* (2006.01)
*H02G 3/04* (2006.01)
*H02G 15/013* (2006.01)
*H02G 15/18* (2006.01)
*H01R 4/72* (2006.01)
*H02G 15/188* (2006.01)

(52) U.S. Cl.
CPC ......... *H02G 3/0406* (2013.01); *H02G 15/013* (2013.01); *H02G 15/18* (2013.01); *H05K 9/0098* (2013.01); *H01R 4/72* (2013.01); *H02G 15/188* (2013.01)

(58) Field of Classification Search
USPC ...................................................... 174/72 A
See application file for complete search history.

(56) References Cited

U.S. PATENT DOCUMENTS

| | | | | |
|---|---|---|---|---|
| 4,797,512 A | * | 1/1989 | Kumagai | H02G 15/18 174/135 |
| 4,879,807 A | * | 11/1989 | Roucaute | H01R 4/72 174/88 C |
| 5,217,392 A | | 6/1993 | Hosler, Sr. | |
| 5,306,870 A | * | 4/1994 | Abat | H01R 9/0506 174/659 |
| 5,422,438 A | * | 6/1995 | Lamome | H01R 4/203 174/76 |
| 6,066,800 A | * | 5/2000 | Renaud | H01B 7/0045 174/36 |
| 6,155,871 A | * | 12/2000 | Machado | H02G 3/088 439/535 |
| 6,246,001 B1 | * | 6/2001 | Fukui | H01R 9/034 174/78 |
| 6,257,938 B1 | | 7/2001 | Day et al. | |
| 6,394,849 B2 | * | 5/2002 | Kasai | H01R 9/2458 439/655 |
| 6,603,074 B2 | * | 8/2003 | Seo | H02G 3/0468 174/102 D |
| 7,658,647 B2 | * | 2/2010 | Reker | H01R 13/6658 439/607.41 |
| 8,003,888 B2 | * | 8/2011 | Owen, Sr. | H02G 1/14 174/135 |
| 2011/0155458 A1 | * | 6/2011 | Kato | B60R 16/0215 174/74 R |
| 2015/0114711 A1 | | 4/2015 | Dew et al. | |
| 2016/0134096 A1 | * | 5/2016 | Kett | H01R 31/02 174/360 |

FOREIGN PATENT DOCUMENTS

| | | |
|---|---|---|
| JP | 2016181700 | 10/2016 |
| WO | 2014070851 A1 | 5/2014 |
| WO | 2015/007744 A2 | 1/2015 |

OTHER PUBLICATIONS

Japanese Office Action issued in Japanese Patent Application No. 2016-060936 dated Feb. 28, 2017. Translation provided by Saikyo Patent Office IP Logistics.

* cited by examiner

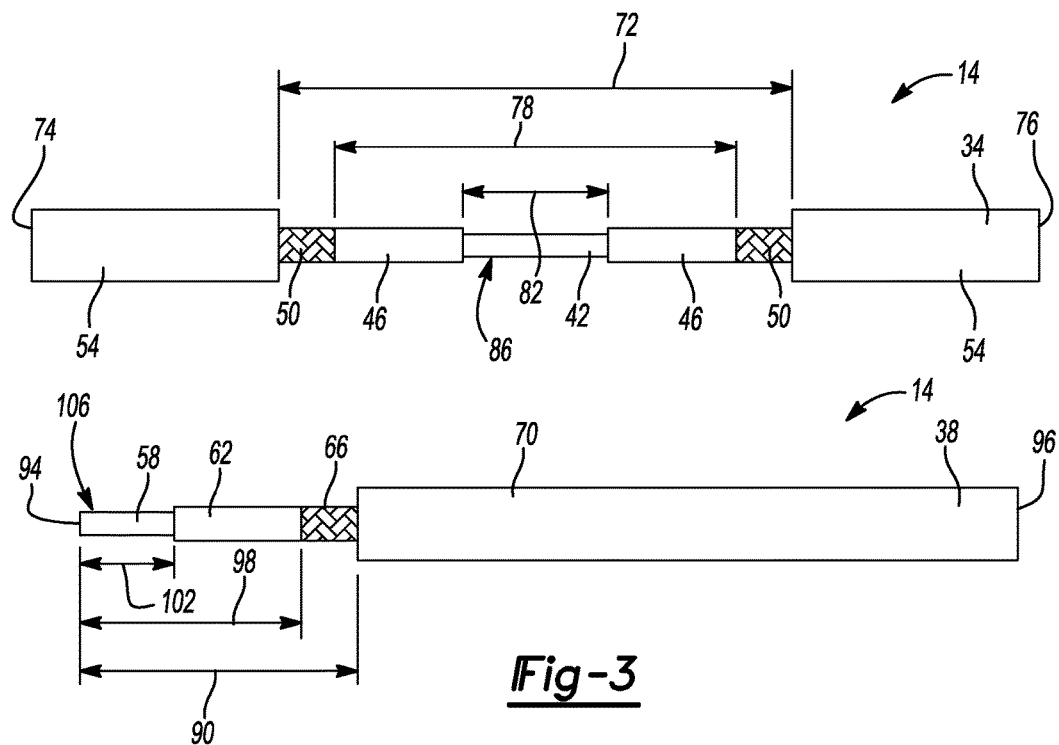
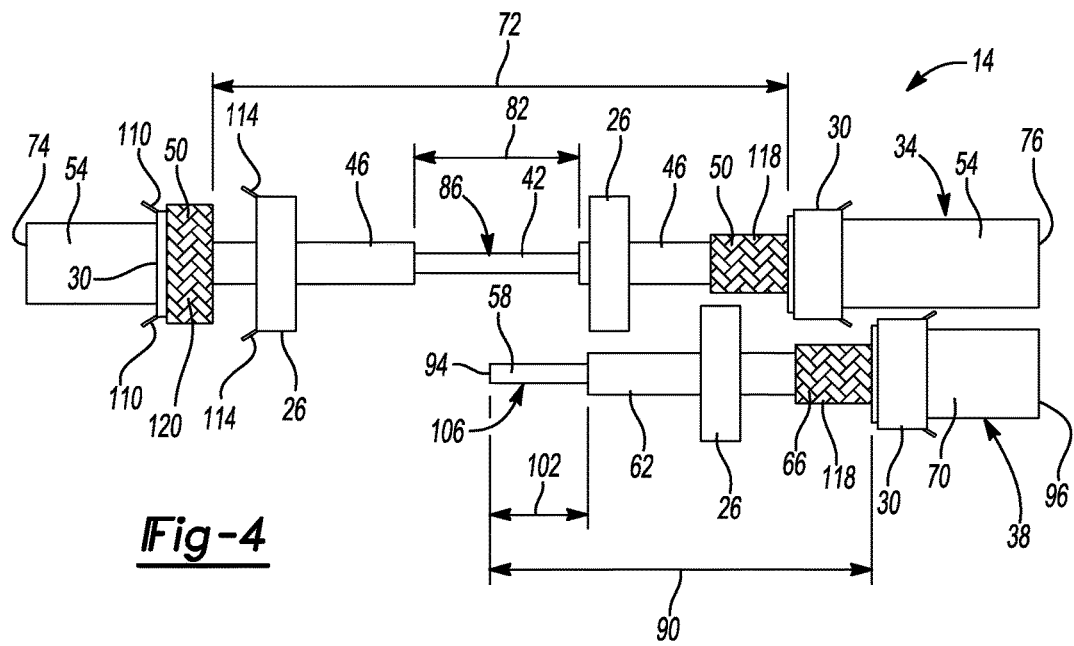

ELECTROMAGNETIC INTERFERENCE SPLICE SHIELD

FIELD

The present disclosure relates to wire harness splitter assemblies or splice devices, and specifically to improved electromagnetic interference splice shields for such splice devices.

BACKGROUND

This section provides background information related to the present disclosure and is not necessarily prior art.

Splitter assemblies or splice devices in wire harnesses are generally used to split a single electrical conduit or wire into multiple electrical wires or combine multiple electrical wires into a single electrical wire. Often, these splitter assemblies come in the form of junction blocks that are capable of splitting two wires into four or more wires. Junction blocks contain a large number of parts and thus can require complicated assembly processes and can be very expensive. Further, junction boxes are relatively bulky and occupy significant space, presenting design challenges and packaging issues.

Additionally, electrical wire connections are often located in the vehicle's chassis and are therefore exposed to external influences such as weather, wind, moisture, and contaminants from the surrounding environment. The effect on wire connection points is that over time they can become corroded; generate increased resistance, and potentially undesired contact between the wires.

SUMMARY

This section provides a general summary of the disclosure, and is not a comprehensive disclosure of its full scope or all of its features.

In certain aspects, a splice device is provided that includes a splice shield for enclosing a junction between a first electrically conductive conduit and a second electrically conductive conduit. Each of a plurality of ferrules respectively overlays a portion of the first electrically conductive conduit and a portion of the second electrically conductive conduit. Each of a plurality of ring collars respectively overlay and is fixed to the plurality of ferrules. The splice shield is fixed to the plurality of ring collars and serves to electromagnetically shield the junction from an external environment.

The splice device may further include a junction that is an ultrasonic weld joint formed by bonding the first electrically conductive conduit to the second electrically conductive conduit by ultrasonic welding.

The splice device may further include a first electrically conductive conduit that comprises a first conductive core, a first inner insulative layer, a first braided sleeve, and a first external insulative cover and a second electrically conductive conduit that comprises a second conductive core, a second inner insulative layer, a second braided sleeve, and a second external insulative cover. The plurality of ferrules may each respectively overlay a portion of the first external insulative cover, the first braided sleeve, and the first inner insulative layer and a portion of the second external insulative cover, the second braided sleeve, and the second inner insulative layer.

The splice device may further include a first electrically conductive conduit that defines a first exposed region where the first inner insulative layer, the first braided sleeve, and the first external insulative cover are removed from the first conductive core and a second electrically conductive conduit that defines a second exposed region where the second inner insulative layer, the second braided sleeve, and the second external insulative cover are removed from the second conductive core. The junction may be formed between the first exposed region and the second exposed region.

The splice device may further include a portion of the first external insulative cover on the first electrically conductive conduit that is removed to expose the first braided sleeve, a portion of the first braided sleeve that is removed to expose the first inner insulative layer, and a portion of the first inner insulative layer that is removed to expose the first conductive core thereby defining the first exposed region, and a portion of the second external insulative cover on the second electrically conductive conduit that is removed to expose the second braided sleeve, a portion of the second braided sleeve that is removed to expose the second inner insulative layer, and a portion of the second inner insulative layer that is removed to expose the conductive core thereby defining the second exposed region.

The splice device may further include a portion of a first of the plurality of ferrules positioned over the first external insulative cover at a location adjacent to a first exposed braided sleeve on the first conduit. The first exposed braided which is folded over the first of the plurality of ferrules. A first of the plurality of ring collars is disposed over the folded first exposed braided sleeve. Thus, the splice device includes the first ring collar disposed over the first ferrule that is disposed on the first external insulative cover at the location, where the first braided sleeve is sandwiched between the first ring collar and the first ferrule. Further, a second of the plurality of ferrules is positioned over the second external insulative cover at a location adjacent to a second exposed braided sleeve. The second exposed braided sleeve on the second electrically conductive conduit is folded over the second of the plurality of ferrules, and a second of the plurality of ring collars that is disposed over the folded second exposed braided sleeve. Thus, the splice device includes the second ring collar disposed over the second ferrule disposed on the second external insulative cover at the location, where the second braided sleeve is sandwiched between the second ring collar and the second ferrule.

The splice device may further include a first and second of the plurality of ring collars that is crimped to the respective first and second of the plurality of ferrules. The first folded exposed braided sleeve may be disposed between the first of the plurality of ring collars and the first of the plurality of ferrules, and the second folded exposed braided sleeve may be disposed between the second of the plurality of ring collars and the second of the plurality of ferrules.

The splice device may further include a plurality of ring collars that is clamped or crimped over the plurality of ferrules.

The splice device may further include a protective cover disposed over the plurality of ferrules and the plurality of ring collars and beneath the splice shield. The protective cover protects the junction from moisture and external contaminants.

The splice device may further include a splice shield that is formed from metal.

The splice device may further include a plurality of ferrules and a plurality of ring collars that are respectively formed from metal.

The splice device may further include a first electrically conductive conduit and a second electrically conductive conduit that are high-voltage shielded wires. The first electrically conductive conduit has a cross-sectional area of greater than or equal to about 70 mm². The second electrically conductive conduit has a cross-sectional area of greater than or equal to about 50 mm².

The splice device may further include a third electrically conductive conduit. The junction connects the first electrically conductive conduit, the second electrically conductive conduit, and the third electrically conductive conduit.

In certain other aspects, a high-voltage splice device is provided that may include a first high-voltage electrically conductive conduit having a first conductive core and defining a first exposed region and a second high-voltage electrically conductive conduit having a second conductive core and defining a second exposed region. The first exposed region is fixed via a bond to the second exposed region. A splice shield is fixed to the first high-voltage electrically conductive conduit and the second high-voltage electrically conductive conduit at a location covering the bond. The splice shield mechanically secures the first and second high-voltage electrically conductive conduits together, while electromagnetically shielding the bond from an external environment.

The high-voltage splice device may further include a bond that is an ultrasonic weld.

The high-voltage splice device may further include a plurality of ferrules each respectively overlaying a portion of the first high-voltage electrically conductive conduit adjacent the first exposed region and a portion of the second high-voltage electrically conductive conduit adjacent the second exposed region and a plurality of ring collars each respectively overlaying and fixed to the plurality of ferrules.

The high-voltage splice device may further include a first high-voltage electrically conductive conduit having a first external insulative cover, a first braided sleeve, and a first inner insulative layer disposed around the first conductive core external to the first exposed region. A second high-voltage electrically conductive conduit may have a second external insulative cover, a second braided sleeve, and a second inner insulative layer disposed around the second conductive core external to the second exposed region. The plurality of ferrules each respectively overlays a portion of the first external insulative cover, the first braided sleeve, and the first inner insulative layer and a portion of the second external insulative cover, the second braided sleeve, and the second inner insulative layer. The plurality of ring collars is respectively disposed over the folded first exposed braided sleeve and the folded second exposed braided sleeve.

In yet other aspects, a high-voltage splice device is provided that includes a first high-voltage electrically conductive conduit having a first conductive core and defining a first exposed region and a second high-voltage electrically conductive conduit having a second conductive core and defining a second exposed region. The first exposed region is fixed via a junction to the second exposed region. A plurality of ferrules each respectively overlay a portion of the first electrically conductive conduit and a portion of the second electrically conductive conduit. A splice shield encloses the junction between the first electrically conductive conduit and the second electrically conductive conduit. The splice shield mechanically secures the first and second high-voltage electrically conductive conduits together and electromagnetically shields the junction from an external environment. A plurality of ring collars each respectively overlays and is fixed to the plurality of ferrules. The splice shield is fixed to the plurality of ring collars.

In certain other aspects, a method of assembling a high-voltage splice device is provided that may include forming a first exposed region in a first electrically conductive conduit and forming a second exposed region in a second electrically conductive conduit. Then, a portion of the first electrically conductive conduit and a portion of the second electrically conductive conduit are overlaid with a plurality of ferrules. The plurality of ferrules are overlaid and fixed with a plurality of ring collars. The first exposed region and the second exposed region are mechanically and electrically joined in a junction. The junction between the first electrically conductive conduit and the second electrically conductive conduit is then enclosed and electromagnetically shielded using a splice shield fixed to the plurality of ring collars.

The method of assembling a high-voltage splice device may further include mechanically and electrically joining the first exposed region and the second exposed region by ultrasonic welding.

The method of assembling a high-voltage splice device may further include overlaying a portion of a first external insulative cover, a first braided sleeve, and a first inner insulative layer in the first electrically conductive conduit with the plurality of ferrules and overlaying a portion of a second external insulative cover, a second braided sleeve, and a second inner insulative layer in the second electrically conductive conduit with the plurality of ferrules.

The method of assembling a high-voltage splice device may further include removing the first inner insulative layer, the first braided sleeve, and the first external insulative cover from the first electrically conductive conduit to define the first exposed region and removing the second inner insulative layer, the second braided sleeve, and the second external insulative cover from the second electrically conductive conduit to define the second exposed region.

The method of assembling a high-voltage splice device may further include positioning a first of the plurality of ferrules over the first external insulative cover at a location adjacent to the exposed first braided sleeve, folding the first exposed braided sleeve on the first conduit over the first of the plurality of ferrules, and arranging a first of the plurality of ring collars over the folded first exposed braided sleeve and positioning a second of the plurality of ferrules over the second external insulative cover at a location adjacent to the exposed second braided sleeve, folding the second exposed braided sleeve on the second electrically conductive conduit over the second of the plurality of ferrules, and arranging a second of the plurality of ring collars over the folded second exposed braided sleeve.

The method of assembling a high-voltage splice device may further include crimping the first and second of the plurality of ring collars to the respective first and second of the plurality of ferrules, where the first folded exposed braided sleeve is disposed between the first of the plurality of ring collars and the first of the plurality of ferrules, and the second folded exposed braided sleeve is disposed between the second of the plurality of ring collars and the second of the plurality of ferrules.

The method of assembling a high-voltage splice device may further include clamping or crimping the plurality of ring collars over the plurality of ferrules.

The method of assembling a high-voltage splice device may further include positioning a protective cover over the plurality of ferrules and the plurality of ring collars and beneath the splice shield and protecting the junction from moisture and external contaminants.

The method of assembling a high-voltage splice device may further include connecting a third electrically conductive conduit with the first electrically conductive conduit and the second electrically conductive conduit Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 3 is a top view of primary and secondary conduits or cables according to certain aspects of the present disclosure;

FIG. 4 is a top view of the primary and secondary conduits or cables of FIG. 3;

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting.

Figure 1:
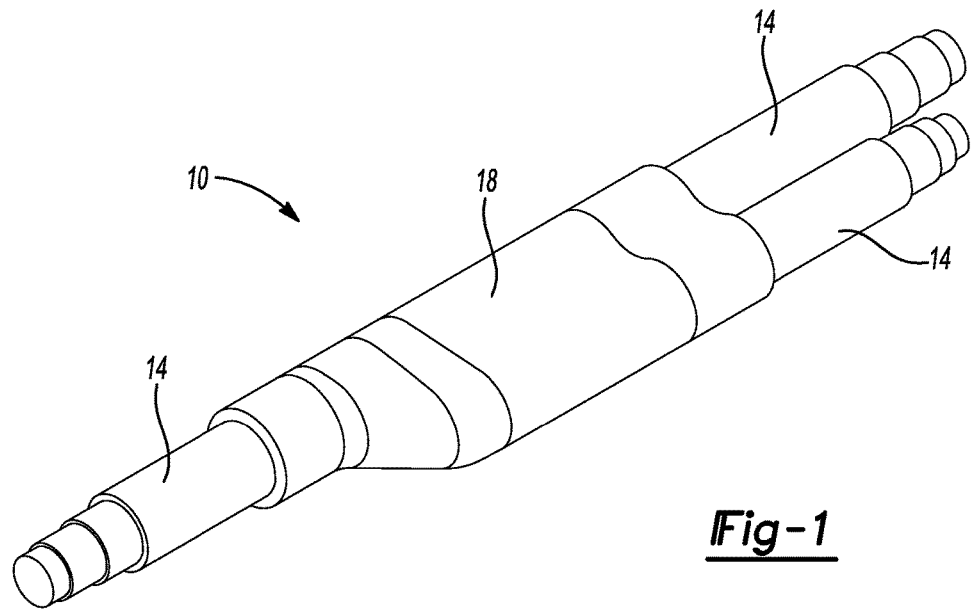
FIG. 1 is an elevated perspective view of a center splice device according to certain aspects of the present disclosure.
Figure 2:
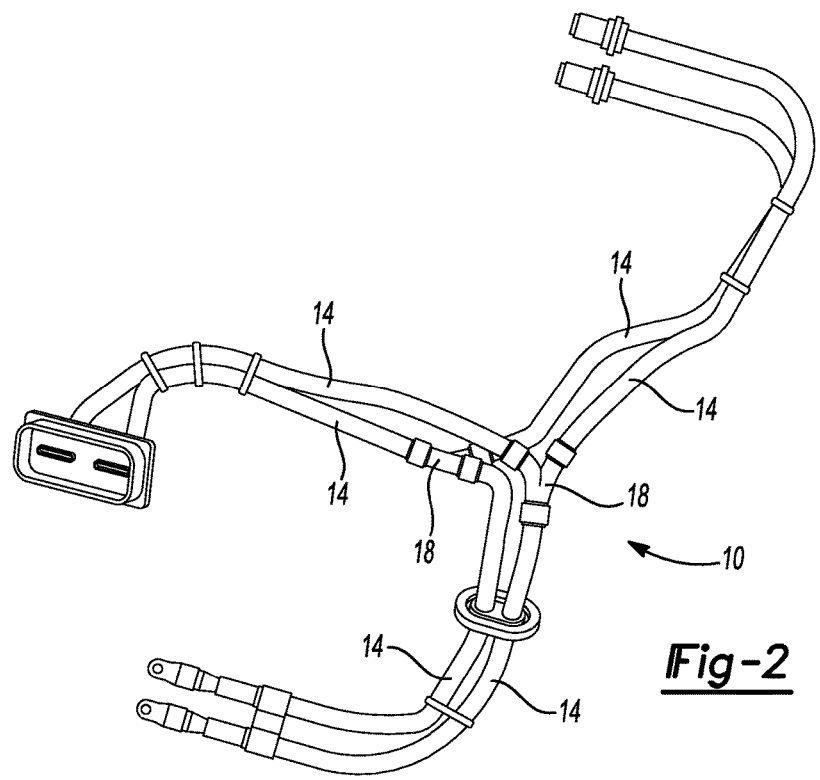
FIG. 2 is an environmental view of the center splice device of FIG. 1.
Figure 6:
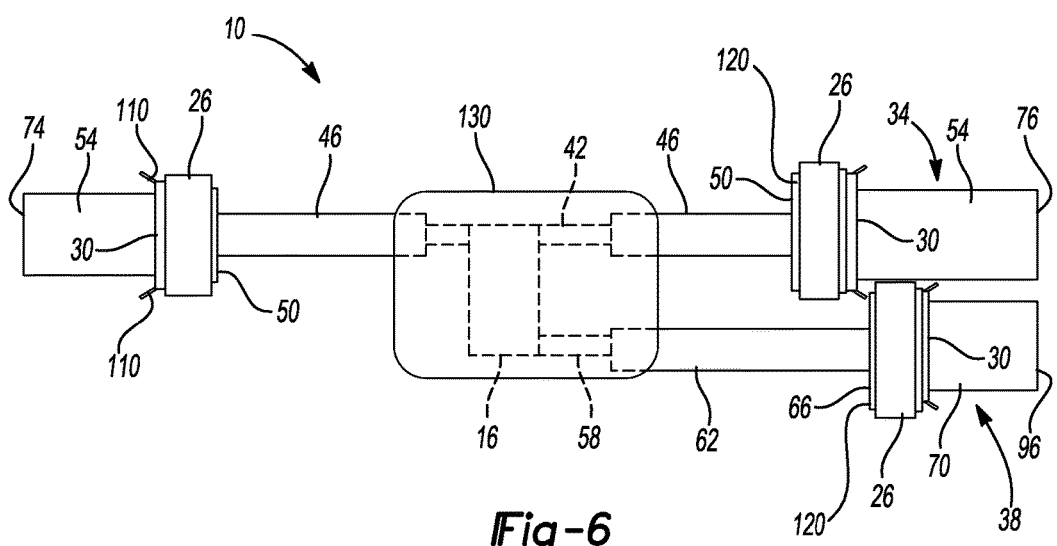
FIG. 6 is a top view of wiring of the center splice device of FIG. 1.
Figure 7:
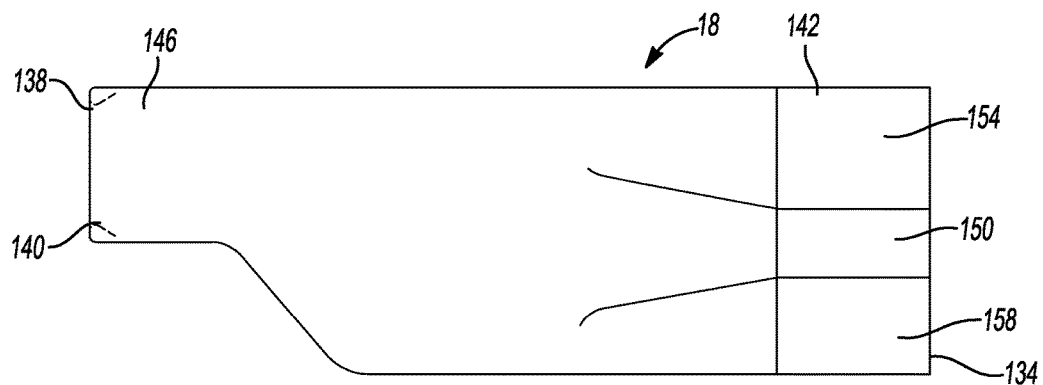
FIG. 7 is a top view of a splice shield of the center splice device of FIG. 1.
Figure 8:
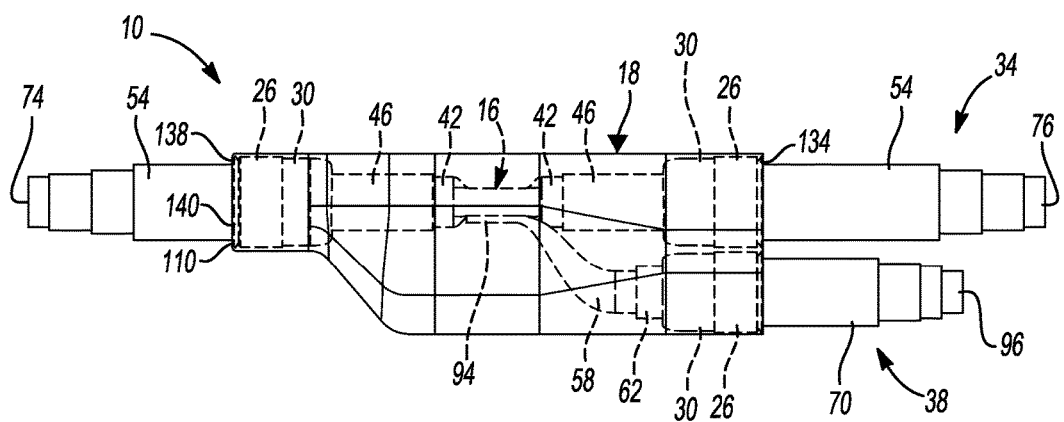
FIG. 8 is a top view of the center splice device of FIG. 1.

FIGS. 1-9 illustrate a center splice device according to various aspects of the present disclosure. Referring to FIGS. 1, 2 and 8, a center splice device 10 joins a plurality of conduits (either positive or negative), such as cables 14, that are connected together in a junction or bond to simplify assembly and reduce product assembly cycle time resulting in labor and equipment cost reduction. The junction 18 is a point where wires of the conduits 14 are electrically and mechanically coupled together, which could be a bond. Splice device 10 includes a splice shield, or electromagnetic (EMI) shield, 18 that mechanically and electrically connects the cables 14, while electromagnetically shielding and protecting the bond between cables 14 from an external environment. Splice device 10 further includes a plurality of ring collars 26 and a plurality of inner ferrules 30 that are used to bond, insulate, and protect the plurality of cables 14 (FIG. 8).

Referring specifically to FIG. 3, the plurality of cables 14 may include a primary cable 34 and a secondary cable 38. In certain variations, any of cables 14 may respectively be high-voltage cables, which typically means that the cable is rated to a voltage capacity of greater than or equal to about 2 kV. By way of example, the primary cable 34 may be a high-voltage (HE) shielded cable that has a cross-sectional area of greater than or equal to about 70 mm$^2$. The secondary cable 38 may be a high-voltage (HE) shielded cable that has a cross-sectional area of greater than or equal to about 50 mm$^2$. While the primary cable 34 is described as a 70 mm$^2$ HE cable and the secondary cable is described as a 50 mm$^2$ HE cable, it is understood that these cables are not limited to these sizes. Other embodiments may utilize any size primary and secondary cable. Further, the primary cable and secondary cable may be the same size cable or may be different size cables.

In certain variations, the plurality of cables 14 may be insulated conduits, such as insulated high-voltage wires. By way of example, the primary cable 34 may further include a conductive core wire 42, over which is disposed an inner insulative layer 46, a braided sleeve 50, and an external insulative cover 54. The secondary cable 38 may likewise further include a conductive core wire 58, an inner insulative layer 62, a braided sleeve 66, and an external insulative cover 70. The conductive core wires 42, 58 may be formed of electrically conductive materials, such as copper or aluminum. The conductive conduits or core wires 42, 58 may be a solid conductive core or a plurality of distinct strands or wires, as well. The inner insulative layers 46, 62 may be formed from conventional electrically insulating materials, such as cross-linked elastomer (AXLE), cross-linked polyethylene (PEP), thermoplastic elastomers (TPE), polyethylene (PE), or other known insulating materials. The braided sleeves 50, 66 may be formed from a material such as a tinned copper braid shield, a copper mesh, saturated polyester monofilaments, polyethylene terephthalate (PET), fiberglass, combinations thereof, or other braided sleeve materials. The external insulative covers 54, 70 may be formed of an electrically insulating material, such as cross-linked elastomer (XLE), extruded polyethylene (PE), polyvinylchloride (PVC), or other insulating materials, by way of example.

Figure 5:
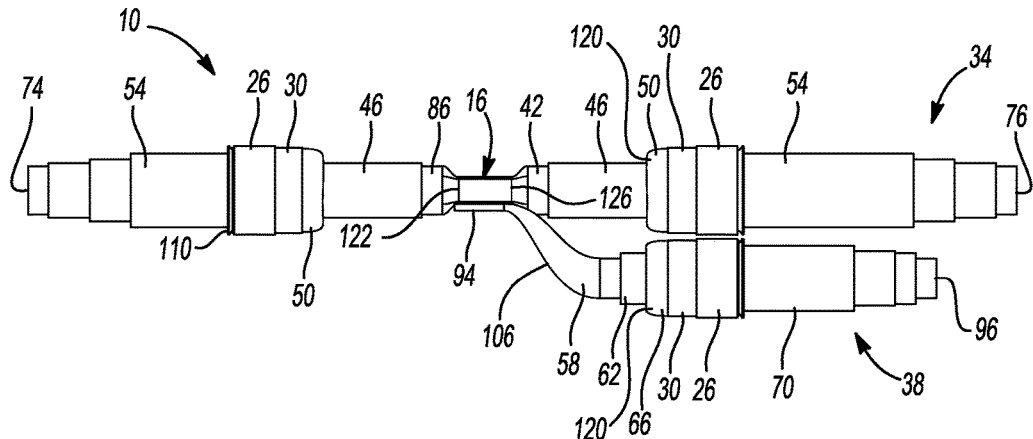
FIG. 5 is a top view of wiring of the center splice device of FIG. 1.

Secondary cable 38 may be connected, coupled, or bonded to the primary cable 34 at junction 16, described in more detail below. Connecting, coupling, or bonding the secondary cable 38 to the primary cable 34 electrically and mechanically joins the secondary cable 38 and the primary cable 34 together. A terminal end 106 of secondary cable 38 may be joined, for example, via a bonding process, to a first exposed region 86 of primary cable 34 through ultrasonic welding (e.g., a splice nugget in FIGS. 5 and 8, represented schematically by box 16 in FIGS. 6 and 11), described in more detail below. While ultrasonic welding is described to bond the secondary cable 38 to the primary cable 34, it is understood that in other embodiments any bonding method may be used to secure the secondary cable 38 to the primary cable 34, such as, for example, resistance, laser welding, and splice terminal crimp.

With reference to FIGS. 3 and 4, and in preparation for bonding, a portion 72 of the external insulative cover 54 may be removed from the primary cable 34 between a first region 74 and a second region 76 of the primary cable revealing the braided sleeve 50. For example only, the portion 72 may be approximately 85 millimeters (mm) for a 1500 mm long primary cable 34. A portion 78 of the braided sleeve 50 may be removed from the primary cable 34 at the center of the portion 72, revealing the inner insulative layer 46. For example only, the portion 78 may be approximately 65 mm for a 1500 mm primary cable 34. A portion 82 of the inner insulation 46 may be removed from the primary cable 34 at the center of the portion 78, revealing the conductive core wire 42, creating a center strip or first exposed region 86 of core wire 42 for bonding. For example only, the portion 82 and center strip 86 may be approximately 25 mm in length.

In further preparation for bonding, a portion 90 of the external insulative cover 70 of the secondary cable 38 may be removed from a first end 94, opposite a second region 96, revealing the braided sleeve 66. For example only, the portion 90 may be approximately 60 mm for a 750 mm long secondary cable 38. A portion 98 of the braided sleeve 66 may be removed from the first end 94 of the secondary cable 38, revealing the inner insulative layer 62. For example only, the portion 98 may be approximately 50 mm for a 750 mm long secondary cable 38. A portion 102 of the inner insulation may be removed from the first end 94 of the secondary cable 38, revealing the conductive core wire 58 and creating and defining an end strip, a second exposed region, or terminal end region 106 for bonding. For example only, the portion 102 and end strip 106 may be approximately 15 mm in length.

Referring to FIG. 4, and before bonding the end strip or terminal end region 106 of secondary cable 38 to center strip or first exposed region 86 of primary cable 34, ring collars 26 and inner ferrules 30 may be placed on the primary cable 34 and secondary cable 38. The inner ferrules 30 may be cylindrical sleeves formed from metal that strengthen the primary and secondary cables 34, 38 and prevent the external insulative covers 54, 70 from splitting or wearing near the portions 72, 90 that were removed. The inner ferrules 30 can be fixed to respective locations on the primary and secondary cables 34, 38 near or adjacent to either the exposed region 86 or terminal end region 106. More specifically, the inner ferrules 30 can be fixed on the first region 74 or second region 76 of primary cable 34 adjacent to portions 72, 78, and 82 or adjacent to the portions 90, 98, and 102 of the first end 94 of secondary cable 38. For example only, the inner ferrules 30 may be of a metal, such as brass, aluminum, copper, and the like. In some embodiments, the inner ferrules 30 may also be made of metal materials, such as an unplated brass, plated brass (plated with tin, silver, or gold), zinc plated carbon steel, or other strengthening material. Two ferrules 30 may be placed over the external insulative cover 54 on the primary cable 34, with one ferrule 30 on each side of the portion 72 that was removed from the external insulative cover 54. In some embodiments, one of the ferrules on the primary cable 34 may include a flanged portion 110 that acts as a stop when installing the splice shield 18, as further discussed below. A single ferrule 30 may be placed over the insulating cover 70 on the secondary cable 38 adjacent to the portion 90 that was removed from the external insulative insulating cover 70.

The ring collars 26 may be circular rings or cylindrical sleeves formed from metal that retain the inner ferrules 30 and braided sleeves 50, 66 in place on the external insulative covers 54, 70. The ring collars 26 may further retain and position the splice shield 18 over the bond 16 in the cables 34, 38 (FIG. 8). For example only, the ring collars 26 may be of a brass, aluminum, copper, or other metal. Two ring collars 26 may be placed over the inner insulation 46 on the primary cable 34, with one ring collar 26 on each side of the portion 82 that was removed from the inner insulation 46. In some embodiments, one of the ring collars 26 on the primary cable 34 may include a flanged portion 114 that acts as a stop when installing the splice shield 18, as further discussed below. A single ring collar 26 may be placed over the inner insulation 62 on the secondary cable 38 adjacent to the portion 102 that was removed from the inner insulation 62.

Exposed portions 118 of braided sleeves 50, 66 adjacent to the external insulative covers 54, 70 are folded back over the inner ferrules 30 placed over the external insulative covers 54, 70. Referring additionally to FIG. 5, the ring collars 26 are positioned over folded exposed portions 120 and a hexagonal (HEX) crimp is applied to the ring collars 26 to retain the ring collars 26, folded exposed portions 120, and ferrules 30 in place on the external insulative covers 54, 70 of the primary cable 34 and secondary cable 38.

Now referring to FIG. 5, the exposed terminal end region 106 of conductive core wire 58 of the secondary cable 38 may be bonded to the exposed region 86 of core wire 42 of the primary cable 34. In some embodiments, the end strip 106 may be bonded to the center strip 86 through ultrasonic welding. In ultrasonic welding, the end strip 106 and center strip 86 are held together under pressure and high-frequency ultrasonic acoustic vibrations are locally applied to create the solid-state weld or bond 16 (e.g., a splice nugget formed by compression of wire strands together via high frequency vibration caused by the ultrasonic energy). While the bond 16 is described as formed from ultrasonic welding, it is understood that the bond 16 could be formed from any bonding method, for example only, through splice terminal crimp, resistive welding, or other bonding methods.

After bonding the terminal end region 106 of secondary cable 38 to exposed region 86 of the primary cable 34, the first region 74 of the primary cable 34 may extend in a first direction from the bond 16 and the second region 76 of the primary cable 34 and the second region 96 of the secondary cable 38 may extend in a second, opposite, direction from the bond 16. Thus, the first region 74 of the primary cable 34 may be on a first side 122 of the bond 16 and the second region 76 of the primary cable 34 and the second region 96 of the secondary cable 38 may be on a second side 126 of the bond 16. In certain alternative variations, the splice device 10 may join a plurality of cables. For example only, the splice device may join three (3) or more cables, where there may be a primary cable with a first terminal end, a secondary cable with a second terminal end, and a tertiary cable with a third terminal end, where each of the first, second, and third terminal ends are all joined together.

Referring to FIG. 6, once the exposed terminal end region 106 of conductive core wire 58 of the secondary cable 38 is fixed to the exposed region 86 of core wire 42 of the primary cable 34 at bond 16, a protective cover, which may be a heatshrink tube, 130 is inserted over the bond 16 by sliding the heatshrink tube 130 over the first end 74 of the primary cable 34 and over the bond 16. The heatshrink tube 130 may be approximately 50 mm long for a center strip approximately 25 mm in length and an end strip approximately 15 mm in length bonded together. The heatshrink tube 130 may be formed from a thermoplastic material such as, for example, a polyolefin, fluoropolymers (such as fluorinated ethylene propylene (FEP), polytetrafluoroethylene (PTFE), or polyvinylidene fluoride (PVDF), polyvinylchloride (PVC), neoprene, silicone elastomer or fluoroelastomers, such as VITON™ commercially available from E.I. duPont de Nemours and Co. The protective heatshrink tube 130 thus provides abrasion resistance and environmental sealing protection for the bond 16 and preventing exposure to moisture and other contaminants. The heatshrink tube 130 is centered over the bond 16, and heat is applied to the heatshrink tube 130 to shrink the tube such that it wraps tightly around the bond 16. While the splice device 10 is described as having a protective cover 130 covering the bond, in alternative embodiments, the protective cover 130 could be eliminated and the EMI splice shield 18 could be placed over the connection before a protective cover.

Referring to FIGS. 7-10, the splice shield 18 is inserted over the bond 16 and heatshrink tube 130 to protect and seal the center splice device 10. When installed, the splice shield 18 electrically connects and mechanically connects the primary cable 34 and secondary cable 38 by cooperating with the ring collars 26. Further, splice shield 18 electromagnetically insulates the bond 16. A first end 134 of the splice shield 18 is slid over the first region 74 of the primary cable 34. The splice shield 18 is inserted over the primary cable 34 and bond 16 until a second end 138 of the splice shield 18 contacts the flanged portion 110 of the ferrule 30 on the primary cable 34. The second end 138 of the splice shield 18 may include a rolled-under or lip portion 140 that contacts the flanged portion 110 of the ferrule 30 and prevents the splice shield 18 from sliding further over the primary cable 34. In alternative embodiments, the splice shield 18 may be inserted over the primary cable 34 and bond 16 until the second end 138 of the splice shield 18 contacts the flanged portion 114 of the ring collar 26 on the primary cable 34. In these alternatives, the rolled-over portion or lip portion 140 may contact the flanged portion 114 of the ring collar 26 to prevent further movement of the splice shield 18 over the primary cable 34. Thus, the first end 134 of the splice shield 18 is positioned over the ring collars 26 on the first region 76 and terminal end 96 of the primary cable 34 and secondary cable 38 and the second end 138 of the splice shield 18 is positioned over the ring collar 26 on the first region 74 of the primary cable 34.

The splice shield 18, or EMI shield, may be formed of a metal such as, for example, aluminum, copper, brass (alloys comprising copper and zinc), tin, combinations thereof, or other types of metal suitable for such purposes. Thus, the metal splice shield 18 may be clamped, crimped, welded, or otherwise metallurgically bonded, to the ring collars 26. In other embodiments, the splice shield 18 may be formed of a non-metallic material such as ceramic or plastic and may be adhered to the ring collars 26 via an adhesive/sealant material to seal the bond 16.

The splice shield 18 is formed such that there is a dual port side 142 on the first end 134 for receiving the second region 76 of the primary cable 34 and the end 96 of the secondary cable 38 and a single port 146 on the second end 138 for receiving the first region 74 of the primary cable 34. The dual port side 142 on the first end 134 may include an indented portion 150 between the ports to define a first port 154 and a second port 158. The first port 154 may receive the second end 76 of the primary cable 34 and the second port 158 may receive the second end 96 of the secondary cable 38. If the primary cable 34 is a larger gauge than the secondary cable 38, the first port 154 may be a larger diameter than the second port 158. If the primary cable 34 is the same gauge as the secondary cable 38, the first port 154 may be the same diameter as the second port 158.

Figure 9:
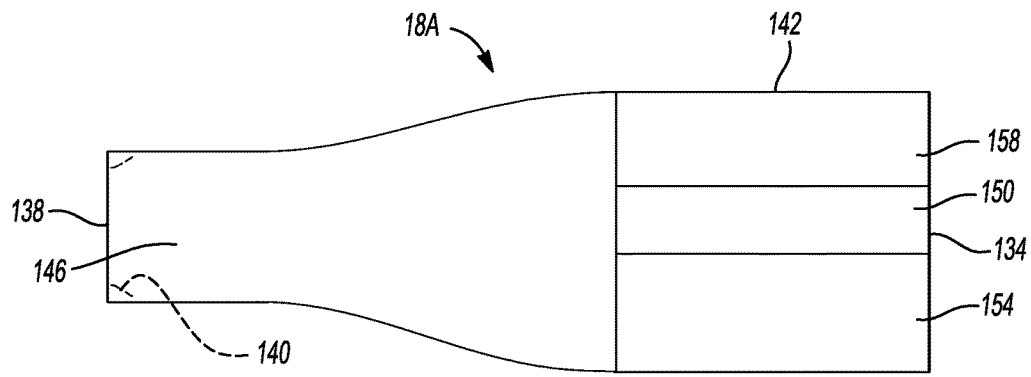
FIG. 9 is a top view of another splice shield of the center splice device.
Figure 10:
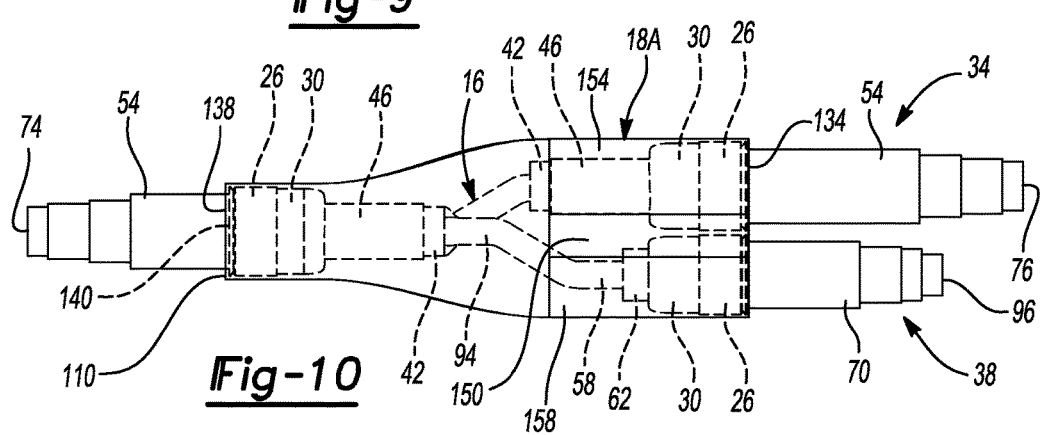
FIG. 10 is a top view of the center splice device incorporating the splice shield of FIG. 9.

Referring to FIGS. 7 and 8, the splice shield 18 may be formed such that the second port 158 is offset from the single port 146 and the first port 154. The first port 154 and single port 146 are aligned such that the primary cable 34 may extend through the first port 154 and single port 146 without unnecessary bending or kinking of the primary cable 34. The second port 158 is offset from the single port 146 and the first port 154 in order to receive the secondary cable 38 that is bonded to the primary cable 34. Referring to FIGS. 9 and 10, and in alternative embodiments, the splice shield 18A has a single port 146 that may be centered between the first port 154 and the second port 158. In this embodiment, the primary cable 34 extends through the first port 154 and single port 146, slightly bending within the splice shield 18 as the primary cable 34 transitions between aligning with the first port 154 and aligning with the single port 146. Like the first port 154, the second port 158 is also offset from the single port 146 and receives the secondary cable 38 that is bonded to the primary cable 34 at bond 16.

Referring again to FIGS. 7-10, the splice shield 18 is crimped over the ring collars 26 such that it provides a weather and environment seal over the bond 16. Any crimping device (not illustrated) may be used to crimp the splice shield 18 over the ring collars 26.

Figure 11:
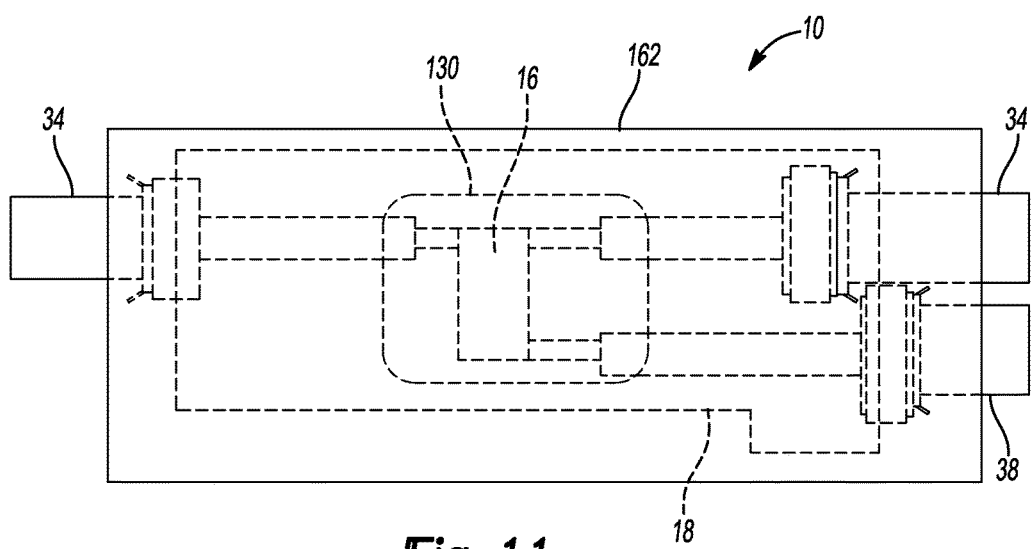
FIG. 11 is a top view of the center splice device of FIG. 1 covered with a protective heatshrink tube cover.

Now referring to FIG. 11, a second heatshrink tube 162 may be applied over the splice shield 18 to further provide a weather and environment seal over the splice shield 18 and the bond 16. The heatshrink tube 162 may be a heatshrink cross-linked Polyolefin cable breakout boot (CCB) providing optimum resistance against common fluids and solvents within a predetermined thermal range (for example only, −55° C. up to 100° C.). The heatshrink tube 162 may further be 1×2 CCB heatshrink tubing. Heat (for example only, 135° C.) is applied to the second heatshrink tube 162 to shrink the tube such that it wraps tightly around the splice shield 18.

The resulting center splice device 10 is sealed from external elements and moisture, but provides a robust, improved design configuration having fewer components than a traditional junction block. Such a splice device is particularly advantageous for use with high-voltage, high cross-sectional area conduit assemblies. The center splice device 10 is less expensive to produce from two perspectives: (1) the center splice device 10 has fewer components than a traditional junction block, thus having streamlined assembly processes, and (2) the materials used in the center splice device 10 are less expensive than the traditional junction blocks. The center splice device 10 is much smaller than traditional junction blocks and, thus, can be more easily integrated into the vehicle and wiring harness systems. Thus, the center splice device 10 provides effective electromagnetic (EMI) shielding in a compact, inexpensive package.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A splice device comprising:
   a splice shield for enclosing a junction between a first electrically conductive conduit and a second electrically conductive conduit;
   a plurality of ferrules each respectively overlaying a portion of the first electrically conductive conduit and a portion of the second electrically conductive conduit; and
   a plurality of ring collars each respectively overlaying and fixed to the plurality of ferrules, wherein the splice shield is fixed to the plurality of ring collars and serves to electromagnetically shield the junction from an external environment, and
   wherein each of the plurality of ferrules includes a flanged portion acting as a stop which directly contacts the splice shield to retain the splice shield on the ring collars.

2. The splice device of claim 1, wherein the junction is an ultrasonic weld joint formed by bonding the first electrically conductive conduit to the second electrically conductive conduit by ultrasonic welding.

3. The splice device of claim 1, wherein the first electrically conductive conduit comprises a first conductive core, a first inner insulative layer, a first braided sleeve, and a first external insulative cover, and the second electrically conductive conduit comprises a second conductive core, a second inner insulative layer, a second braided sleeve, and a second external insulative cover, wherein the plurality of ferrules each respectively overlays a portion of the first external insulative cover, the first braided sleeve, and the first inner insulative layer and a portion of the second external insulative cover, the second braided sleeve, and the second inner insulative layer.

4. The splice device of claim 3, wherein the first electrically conductive conduit defines a first exposed region where the first inner insulative layer, the first braided sleeve, and the first external insulative cover are removed from the first conductive core, and the second electrically conductive conduit defines a second exposed region where the second inner insulative layer, the second braided sleeve, and the second external insulative cover are removed from the second conductive core, wherein the junction is formed between the first exposed region and the second exposed region.

5. The splice device of claim 4, wherein a portion of the first external insulative cover on the first electrically conductive conduit is removed to expose the first braided sleeve, a portion of the first braided sleeve is removed to expose the first inner insulative layer, and a portion of the first inner insulative layer is removed to expose the first conductive core thereby defining the first exposed region, and a portion of the second external insulative cover on the second electrically conductive conduit is removed to expose the second braided sleeve, a portion of the second braided sleeve is removed to expose the second inner insulative layer, and a portion of the second inner insulative layer is removed to expose the conductive core thereby defining the second exposed region.

6. The splice device of claim 5, wherein a first of the plurality of ferrules is positioned over the first external insulative cover at a location adjacent to the exposed first braided sleeve, wherein the first exposed braided sleeve on the first conduit is folded over the first of the plurality of ferrules, and a first of the plurality of ring collars is disposed over the folded first exposed braided sleeve and a second of the plurality of ferrules is positioned over the second external insulative cover at a location adjacent to the exposed second braided sleeve, wherein the second exposed braided sleeve on the second electrically conductive conduit is folded over the second of the plurality of ferrules, and a second of the plurality of ring collars is disposed over the folded second exposed braided sleeve.

7. The splice device of claim 6, wherein the first and second of the plurality of ring collars is crimped to the respective first and second of the plurality of ferrules, wherein the folded first exposed braided sleeve is disposed between the first of the plurality of ring collars and the first of the plurality of ferrules, and the folded second exposed braided sleeve is disposed between the second of the plurality of ring collars and the second of the plurality of ferrules.

8. The splice device of claim 1, wherein the plurality of ring collars is clamped or crimped over the plurality of ferrules.

9. The splice device of claim 1, further comprising a protective cover disposed over the plurality of ferrules and the plurality of ring collars and beneath the splice shield, wherein the protective cover protects the junction from moisture and external contaminants.

10. The splice device of claim 1, wherein the splice shield is formed from metal.

11. The splice device of claim 1, wherein the plurality of ferrules and the plurality of ring collars are respectively formed from metal.

12. The splice device of claim 1, wherein the first electrically conductive conduit and the second electrically conductive conduit are highvoltage shielded wires, wherein the first electrically conductive conduit has a cross-sectional area of greater than or equal to about 70 mm2 and the second electrically conductive conduit has a cross-sectional area of greater than or equal to about 50 mm2.

13. The splice device of claim 1, further comprising a third electrically conductive conduit, wherein the junction connects the first electrically conductive conduit, the second electrically conductive conduit, and the third electrically conductive conduit.

14. A high-voltage splice device comprising:
    a first high-voltage electrically conductive conduit having a first conductive core and defining a first exposed region;
    a second high-voltage electrically conductive conduit having a second conductive core and defining a second exposed region, wherein the first exposed region is fixed via a bond to the second exposed region; and
    a splice shield fixed to the first high-voltage electrically conductive conduit and the second high-voltage electrically conductive conduit at a location covering the bond, wherein the splice shield mechanically secures the first and second high-voltage electrically conductive conduits together, while electromagnetically shielding the bond from an external environment,
    wherein the splice shield includes a plurality of ferrules, each of the plurality of ferrules having a flanged portion acting as a stop which directly contacts the splice shield to retain the splice shield on the first and second high-voltage electrically conductive conduits.

15. The high-voltage splice device of claim 14, wherein the bond is an ultrasonic weld.

16. The high-voltage splice device of claim 14, further comprising:
    a plurality of ring collars each respectively overlaying and fixed to the plurality of ferrules, wherein the plurality of ferrules each respectively overlays a portion of the first high-voltage electrically conductive conduit adjacent the first exposed region and a portion of the second high-voltage electrically conductive conduit adjacent the second exposed region.

17. The high-voltage splice device of claim 16, wherein the first high-voltage electrically conductive conduit further comprises a first external insulative cover, a first braided sleeve, and a first inner insulative layer disposed around the first conductive core external to the first exposed region, and the second high-voltage electrically conductive conduit further comprises a second external insulative cover, a second braided sleeve, and a second inner insulative layer disposed around the second conductive core external to the second exposed region, wherein the plurality of ferrules each respectively overlays a portion of the first external insulative cover, the first braided sleeve, and the first inner insulative layer and a portion of the second external insulative cover, the second braided sleeve, and the second inner insulative layer, and the plurality of ring collars is respectively disposed over the folded first exposed braided sleeve and the folded second exposed braided sleeve.

18. A high voltage splice device comprising:
a first high-voltage electrically conductive conduit having a first conductive core and defining a first exposed region;
a second high-voltage electrically conductive conduit having a second conductive core and defining a second exposed region, wherein the first exposed region is fixed via a junction to the second exposed region;
a plurality of ferrules each respectively overlaying a portion of the first electrically conductive conduit and a portion of the second electrically conductive conduit;
a splice shield for enclosing the junction between the first electrically conductive conduit and the second electrically conductive conduit, wherein the splice shield mechanically secures the first and second high-voltage electrically conductive conduits together and electromagnetically shields the junction from an external environment; and
a plurality of ring collars each respectively overlaying and fixed to the plurality of ferrules, wherein the splice shield is fixed to the plurality of ring collars, and
wherein each of the plurality of ferrules includes a flanged portion acting as a stop which directly contacts the splice shield to retain the splice shield on the ring collars.

* * * * *